(12) United States Patent
Iwai et al.

(10) Patent No.: US 7,316,889 B2
(45) Date of Patent: *Jan. 8, 2008

(54) POSITIVE TYPE RESIST COMPOSITION AND RESIST PATTERN FORMATION METHOD USING SAME

(75) Inventors: Takeshi Iwai, Kawasaki (JP); Naotaka Kubota, Kawasaki (JP); Satoshi Fujimura, Kawasaki (JP); Miwa Miyairi, Kawasaki (JP); Hideo Hada, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/347,423

(22) Filed: Feb. 2, 2006

(65) Prior Publication Data

US 2006/0134553 A1    Jun. 22, 2006

Related U.S. Application Data

(60) Division of application No. 11/004,798, filed on Dec. 7, 2004, which is a continuation of application No. 10/467,130, filed as application No. PCT/JP02/12524 on Nov. 29, 2002, now Pat. No. 7,074,543.

(51) Int. Cl.
*G03F 7/004* (2006.01)

(52) U.S. Cl. ............... 430/270.1; 430/905; 430/910

(58) Field of Classification Search ......... 430/270.1, 430/905, 910; 403/905
See application file for complete search history.

(56) References Cited

U.S. PATENT DOCUMENTS

| | | | |
|---|---|---|---|
| 5,968,713 A | 10/1999 | Nozaki et al. | 430/326 |
| 6,004,720 A | 12/1999 | Takechi et al. | 430/270.1 |
| 6,013,416 A | 1/2000 | Nozaki et al. | 430/283.1 |
| 6,200,725 B1 | 3/2001 | Takechi et al. | 430/270.1 |
| 6,239,231 B1 | 5/2001 | Fujishima et al. | 525/337 |
| 6,280,898 B1 | 8/2001 | Hasegawa et al. | |
| 6,329,125 B2 | 12/2001 | Takechi et al. | 430/326 |
| 6,344,304 B1 | 2/2002 | Takechi et al. | 430/270.1 |
| 6,348,297 B1 | 2/2002 | Uetani et al. | 430/270.1 |
| 6,479,211 B1 | 11/2002 | Sato et al. | 430/270.1 |
| 6,555,289 B2 | 4/2003 | Sasaki et al. | |
| 6,753,124 B2 | 6/2004 | Nishimura et al. | 430/270.1 |
| 6,858,370 B2 | 2/2005 | Kodama et al. | |
| 6,964,839 B1 | 11/2005 | Choi et al. | |
| 6,982,140 B2 | 1/2006 | Hada et al. | |
| 7,074,543 B2 | 7/2006 | Iwai et al. | |
| 2001/0044070 A1 | 11/2001 | Uetani et al. | |
| 2002/0048720 A1 | 4/2002 | Sasaki et al. | |
| 2003/0087183 A1 | 5/2003 | Nishi et al. | 430/270.1 |
| 2003/0113661 A1* | 6/2003 | Uetani et al. | 430/270.1 |
| 2004/0058269 A1 | 3/2004 | Hada et al. | |
| 2004/0110085 A1 | 6/2004 | Iwai et al. | |
| 2006/0127808 A1* | 6/2006 | Iwai et al. | 430/270.1 |
| 2006/0134553 A1 | 6/2006 | Iwai et al. | |

FOREIGN PATENT DOCUMENTS

| | | |
|---|---|---|
| CN | 1245910 A | 3/2000 |
| EP | 99116705.7 | 3/2000 |
| JP | 02-146803 | 2/1992 |
| JP | 2881969 | 4/1992 |
| JP | 04-156818 | 12/1993 |
| JP | 09-130131 | 12/1998 |
| JP | 06-165935 | 1/1999 |
| JP | 2000019732 | 1/2000 |
| JP | 11-238542 | 5/2000 |
| JP | 11-146775 | 12/2000 |
| JP | 2001060583 | 3/2001 |
| JP | 11-296028 | 7/2001 |
| JP | 2001296659 | 10/2001 |
| JP | 2003043690 | 2/2003 |
| JP | 2003122007 | 4/2003 |
| KR | 2000-0017485 | 3/2000 |
| KR | 2000-0077438 | 12/2000 |

OTHER PUBLICATIONS

PCT/ISA/220 Search Report of PCT/JP02/12524, Mar. 18, 2003.

* cited by examiner

*Primary Examiner*—John S. Chu
(74) *Attorney, Agent, or Firm*—Knobbe Martens Olson & Bear LLP

(57) ABSTRACT

There is provided a positive type resin composition comprising (A) a resin component comprising within the principal chain a structural unit derived from a (meth)acrylate ester and incorporating an acid dissociable, dissolution inhibiting group containing a polycyclic group on an ester side chain section, for which the solubility in alkali increases under the action of acid, (B) an acid generator component which generates acid on exposure, and (C) an organic solvent, wherein the component (A) comprises both a structural unit derived from a methacrylate ester and a structural unit derived from an acrylate ester. According to such a resist composition, a resist pattern can be formed which displays little surface roughness and line edge roughness on etching, and also offers excellent resolution and a wide depth of focus range.

8 Claims, No Drawings

POSITIVE TYPE RESIST COMPOSITION AND RESIST PATTERN FORMATION METHOD USING SAME

CROSS REFERENCE TO RELATED APPLICATION

This application is a divisional of U.S. patent application Ser. No. 11/004,798, filed on Dec. 7, 2004, entitled "POSITIVE TYPE RESIST COMPOSITION AND RESIST PATTERN FORMATION METHOD USING SAME," which is a continuation of U.S. patent application Ser. No. 10/467,130, filed on Aug. 1, 2003, now U.S. Pat. No. 7,074,543, entitled "POSITIVE TYPE RESIST COMPOSITION AND RESIST PATTERN FORMATION METHOD USING SAME."

TECHNICAL FIELD

The present invention relates to a positive type resist composition, and more specifically relates to a chemically amplified positive type resist composition for use with a wavelength of no more than 200 nm, and particularly an ArF excimer laser.

BACKGROUND ART

Until recently, polyhydroxystyrenes or derivatives thereof in which the hydroxyl groups are protected with an acid dissociable, dissolution inhibiting group, which display high transparency relative to a KrF excimer laser (248 nm), have been used as the base resin component of chemically amplified resists.

However, these days, the miniaturization of semiconductor elements has progressed even further, and the development of processes using ArF excimer lasers (193 nm) is being vigorously pursued.

For processes using an ArF excimer laser as the light source, resins comprising a benzene ring such as the polyhydroxystyrenes described above have insufficient transparency relative to the ArF excimer laser (193 nm).

Consequently, resins capable of resolving this problem, containing no benzene rings, and comprising a structural unit derived from a (meth)acrylate ester incorporating a polycyclic hydrocarbon ring such as an adamantane ring within the principal chain are attracting considerable interest, and many materials have already been proposed (Japanese Patent (Granted) Publication No. 2881969, Japanese Unexamined Patent Application, First Publication No. Hei 5-346668, Japanese Unexamined Patent Application, First Publication No. Hei 7-234511, Japanese Unexamined Patent Application, First Publication No. Hei 9-73173, Japanese Unexamined Patent Application, First Publication No. Hei 9-90637, Japanese Unexamined Patent Application, First Publication No. Hei 10-161313, Japanese Unexamined Patent Application, First Publication No. Hei 10-319595 and Japanese Unexamined Patent Application, First Publication No. Hei 11-12326).

However, with the development of different etching films in recent years, a variety of etching gases can now be used, and as a result, a new problem has arisen in that surface roughness appears on the resist film following etching.

This surface roughness is different from one which conventional dry etching resistance meet, and in a film etched using a resist pattern as a mask, appears as distortions around the hole patterns in a contact hole pattern, or as line edge roughness in a line and space pattern. Line edge roughness refers to non-uniform irregularities in the line side walls.

Furthermore, in addition to the surface roughness described above, line edge roughness also occurs in the resist pattern following developing.

This line edge roughness also appears as distortions around the hole patterns in a contact hole pattern or as non-uniform irregularities in the line side walls in a line and space pattern.

In addition, the design rules required in modern semiconductor element production continue to become more stringent, and a resolution of no more than 150 nm, and in the vicinity of 100 nm is now required. As a result, further improvements in resolution are needed.

Furthermore, in addition to this improvement in resolution, widening of the depth of focus range characteristics is also desirable.

However, with conventional resist compositions, resolving the above problems has been unsatisfactory, and further improvements have been keenly sought.

DISCLOSURE OF INVENTION

An object of the present invention is to provide a chemically amplified positive type resist composition which displays little surface roughness on etching and little line edge roughness of the resist pattern following developing, and also offers excellent resolution and a wide depth of focus range, as well as a resist pattern formation method which uses such a composition.

Taking the above circumstances into consideration and as a result of intensive investigations, the inventors of the present invention discovered that by using a resin comprising both a structural unit derived from a methacrylate ester and a structural unit derived from an acrylate ester as a base resin component, the above problems could be resolved, and were hence able to complete the present invention.

In other words, a positive type resist composition of the present invention is a positive type resist composition comprising (A) a resin component comprising within the principal chain a structural unit derived from a (meth)acrylate ester and incorporating an acid dissociable, dissolution inhibiting group containing a polycyclic group on an ester side chain section, for which the solubility in alkali increases under the action of acid, (B) an acid generator component which generates acid on exposure, and (C) an organic solvent (C), wherein the component (A) comprises both a structural unit derived from a methacrylate ester (hereafter this unit may be abbreviated as a "methacrylate ester structural unit") and a structural unit derived from an acrylate ester (hereafter this unit may be abbreviated as an "acrylate ester structural unit").

The term "(meth)acrylate" refers to either one, or both of acrylates and methacrylates. Furthermore, the term "structural unit" refers to a monomer unit which contributes to the formation of a polymer.

A method of forming a resist pattern according to the present invention comprises the steps of applying a positive type resist composition of the present invention to a substrate, conducting a prebake, performing selective exposure, then conducting PEB (post exposure baking), and performing alkali developing to form a resist pattern.

BEST MODE FOR CARRYING OUT THE INVENTION

As follows is a more detailed description of the present invention.

In the component (A), the action of the acid generated from the component (B) on exposure causes the aforementioned highly etching resistant, acid dissociable, dissolution inhibiting group containing a polycyclic group to dissociate, and the entire component (A) changes from an alkali insoluble state to an alkali soluble state.

Consequently, when exposure is conducted through a mask pattern during the formation of a resist pattern, the exposed sections of the composition display a significant increase in solubility relative to alkali, enabling alkali developing to be used.

In the component (A), the term "comprising both a methacrylate ester structural unit and an acrylate ester structural unit" means that there are no particular restrictions on the form of the component, provided the component (A) incorporates both a methacrylate ester structural unit and an acrylate ester structural unit. For example, the component (A) may be a material comprising a copolymer (A1): a copolymer comprising a methacrylate ester structural unit and an acrylate ester structural unit, or may be a material comprising a mixed resin (A2): a mixed resin of a polymer comprising at least a methacrylate ester structural unit and a polymer comprising at least an acrylate ester structural unit. Either one, or both of the polymers which constitute this mixed resin (A2) may be a copolymer which corresponds with the copolymer (A1).

Furthermore, other resin components may also be added to the component (A) provided such addition does not impair the effects of the present invention, although in the present invention, a component (A) formed from either one, or both of the aforementioned copolymer (A1) and the aforementioned mixed resin (A2) is preferred.

In addition, for both the copolymer (A1) and the mixed resin (A2), a combination of two or more different materials can also be used.

The relative quantities of the methacrylate ester structural unit and the acrylate ester structural unit within the component (A) are such that relative to the combined number of mols of the methacrylate ester structural unit and the acrylate ester structural unit, the methacrylate ester structural unit account for 10 to 85 mol %, and preferably from 20 to 80 mol %, and the acrylate ester structural unit account for 15 to 90 mol % and preferably from 20 to 80 mol %.

If the quantity of the methacrylate ester structural unit is overly large then the effect in improving the surface roughness is reduced, whereas if the quantity of the acrylate ester structural unit is overly large, there is a danger of a reduction in resolution.

In addition, the component (A) may also be formed from a combination of a plurality of monomer units with different functions, provided the aforementioned methacrylate ester structural unit and the acrylate ester structural unit are incorporated within one of the monomer units.

For example, the component (A) can be ideally formed from:
(i) a structural unit derived from a (meth)acrylate ester, and comprising an acid dissociable, dissolution inhibiting group containing a polycyclic group (hereafter, also referred to as a first structural unit),
(ii) a structural unit derived from a (meth)acrylate ester, and comprising a lactone containing monocyclic group or polycyclic group (wherein the term "cyclic group" within the expression "monocyclic group or polycyclic group" includes a lactone group) (hereafter, also referred to as a second structural unit), and
(iii) a structural unit derived from a (meth)acrylate ester, and comprising a hydroxyl group containing polycyclic group (hereafter, also referred to as a third structural unit).

In this description and the accompanying claims, the term "lactone containing monocyclic group or polycyclic group" refers to a monocyclic group formed from a lactone ring or a polycyclic group containing a lactone ring. Here, a lactone ring refers to a single ring comprising a —CO—O— structure, and this is counted as the first ring. Accordingly, in the case of a group with only a lactone ring, the name "lactone containing monocyclic group" is used, whereas in the case of a group which also contains other ring structures, the name "lactone containing polycyclic group" is used regardless of the structure of the other rings.

In such a case, the first structural unit is essential, and although combinations of the first structural unit with either the second structural unit or the third structural unit are acceptable, components comprising all three of the first through third structural units are preferred in terms of etching resistance, resolution, and adhesion between the resist film and the substrate. A resin which consists of the first through third structural units is more preferable.

In addition, for a component (A) which also comprises a structural unit described below (hereafter also referred to as a fourth structural unit, or as a structural unit (a4)):
(iv) a structural unit derived from a (meth)acrylate ester, and comprising a polycyclic group which is different from the acid dissociable, dissolution inhibiting group containing a polycyclic group of the first structural unit, the lactone containing monocyclic group or polycyclic group of the second structural unit, or the hydroxyl group containing polycyclic group of the third structural unit,
the resolution for isolated patterns through to semi dense patterns (line and space patterns in which for a line width of 1, the space width is within a range from 1.2 to 2) is excellent, and is preferred.

Accordingly, the actual combination of the first structural unit through to the fourth structural unit can be adjusted appropriately in accordance with the desired characteristics and the like.

The component (A) preferably comprises either one, or both of:
a structural unit (a1) derived from an acrylate ester, and comprising an acid dissociable, dissolution inhibiting group containing a polycyclic group, and
a structural unit (a1') derived from a methacrylate ester, and comprising an acid dissociable, dissolution inhibiting group containing a polycyclic group.

If the structural unit derived from a (meth)acrylate ester, and comprising an acid dissociable, dissolution inhibiting group containing a polycyclic group incorporates both the aforementioned structural unit (a1) and the aforementioned structural unit (a1'), then the resolution improves, which is preferred.

In those cases in which both structural units are present, the molar ratio of structural unit (a1): structural unit (a1') is typically within a range from 0.4 to 2.5, and preferably from 0.6 to 1.5 in order to ensure superior co-solubility of the polymer with the structural unit (a1) and the polymer with the structural unit (a1').

Furthermore, the component (A) also preferably comprises either one, or both of:

a structural unit (a2) derived from an acrylate ester, and comprising a lactone containing monocyclic group or polycyclic group, and a structural unit (a2') derived from a methacrylate ester, and comprising a lactone containing monocyclic group or polycyclic group.

The case in which the structural unit derived from a (meth)acrylate ester, and comprising a lactone containing monocyclic group or polycyclic group incorporates both the aforementioned structural unit (a2) and the aforementioned structural unit (a2') is preferred.

In those cases in which both of the above structural units are present, the molar ratio of structural unit (a2): structural unit (a2') is typically within a range from 0.2 to 5.0, and preferably from 0.6 to 1.5 in order to ensure superior co-solubility of the polymer with the structural unit (a2) and the polymer with the structural unit (a2').

In addition, the component (A) also preferably comprises either one, or both of:

a structural unit (a3) derived from an acrylate ester, and comprising a hydroxyl group containing polycyclic group, and a structural unit (a3') derived from a methacrylate ester, and comprising a hydroxyl group containing polycyclic group.

The case in which the structural unit derived from a (meth)acrylate ester, and comprising a hydroxyl group containing polycyclic group incorporates both the aforementioned structural unit (a3) and the aforementioned structural unit (a3') is preferred.

In those cases in which both of the above structural units are present, the molar ratio of structural unit (a3): structural unit (a3') is typically within a range from 0.2 to 5.0, and preferably from 0.6 to 1.5 in order to ensure superior co-solubility of the polymer with the structural unit (a3) and the polymer with the structural unit (a3').

Furthermore of the three pairs of combinations, namely, the pair of the structural units (a1) and (a1'), the pair of the structural units (a2) and (a2') and the pair of the structural units (a3) and (a3'), components comprising at least 2 pairs are preferred, and components comprising all 3 pairs are even more desirable.

In the structural units (a1) and (a1'), examples of the polycyclic group include groups in which one hydrogen atom is removed from a bicycloalkane, a tricycloalkane or a tetracycloalkane.

Specific examples include groups in which one hydrogen atom is removed from a polycycloalkane such as adamantane, norbornane, isobornane, tricyclodecane or tetracyclododecane.

These types of polycyclic groups can be selected appropriately from the multitude of these types of groups that have been proposed for use with ArF resists.

Of these groups, adamantyl groups, norbornyl groups and tetracyclododecanyl groups are preferred from an industrial viewpoint.

Furthermore, there are no particular restrictions on the aforementioned acid dissociable, dissolution inhibiting group, provided that prior to exposure it produces an alkali dissolution inhibiting effect which makes the entire component (A) insoluble in alkali, and following exposure it dissociates through the action of the acid generated from the component (B), converting the entire component (A) to an alkali soluble state.

Typical examples include cyclic or chain type tertiary alkyl esters formed with the carboxyl group of (meth)acrylic acid.

Provided the structural units (a1), (a1') have the functions described above then there are no particular restrictions on the structural units, although cases in which the acid dissociable, dissolution inhibiting group containing a polycyclic group within either one or both (and preferably both) of the structural units (a1) and (a1') is selected from the general formulas (I), (II) and (III) shown below are preferred, as such units display excellent resolution and dry etching resistance.

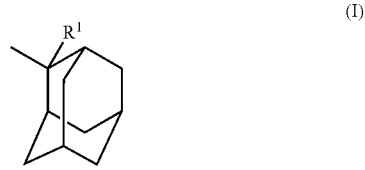
(I)

(wherein, $R^1$ represents a lower alkyl group)

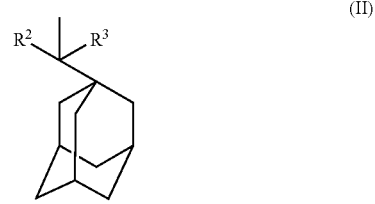
(II)

(wherein, $R^2$ and $R^3$ each represent, independently, a lower alkyl group)

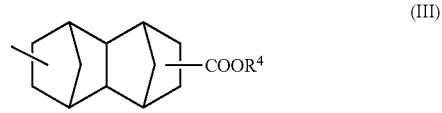
(III)

(wherein, $R^4$ represents a tertiary alkyl group)

Specifically, either one or both (and preferably both) of the structural units (a1) and (a1') are preferably at least one type of structural unit selected from the general formulas (I'), (II') and (III') shown below.

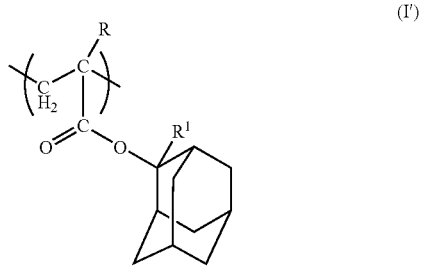
(I')

(wherein, R represents a hydrogen atom or a methyl group, and $R^1$ represents a lower alkyl group, so that the group represents the structural unit (a1) when R is a hydrogen atom, and the structural unit (a1') when R is a methyl group)

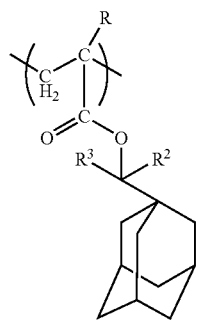

(II')

(wherein, R represents a hydrogen atom or a methyl group, and $R^2$ and $R^3$ each represent, independently, a lower alkyl group, so that the group represents the structural unit (a1) when R is a hydrogen atom, and the structural unit (a1') when R is a methyl group)

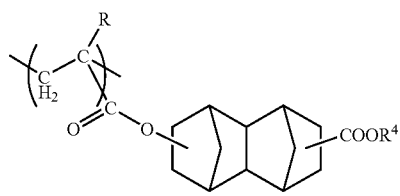

(III')

(wherein, R represents a hydrogen atom or a methyl group, and $R^4$ represents a tertiary alkyl group, so that the group represents the structural unit (a1) when R is a hydrogen atom, and the structural unit (a1') when R is a methyl group).

The structural unit represented by the general formula (I') above represents the case in which the carbon atom adjacent to the oxygen atom (—O—) of a (meth)acrylic acid ester section is a tertiary alkyl group on a cyclic skeleton such as an adamantyl group.

Furthermore, in the general formulas (I) and (I'), R is either a hydrogen atom or a methyl group.

In addition, the group $R^1$ is preferably a lower straight chain or branched alkyl group of 1 to 5 carbon atoms, and suitable examples include methyl groups, ethyl groups, propyl groups, isopropyl groups, n-butyl groups, isobutyl groups, tert-butyl groups, pentyl groups, isopentyl groups and neopentyl groups. Of these, alkyl groups of at least 2 carbon atoms, and preferably of 2 to 5 carbon atoms are preferred, and in such cases, the acid dissociability tends to increase compared with the case in which $R^1$ is a methyl group. However in contrast, from an industrial viewpoint, methyl groups are the most desirable.

The structural unit represented by the general formula (II') represents the case in which the carbon atom adjacent to the oxygen atom (—O—) of a (meth)acrylic acid ester section is a tertiary alkyl group, and a cyclic skeleton such as an adamantyl group exists within this tertiary alkyl group.

In the general formulas (II) and (II'), R represents the same meaning as in the general formulas (I) and (I').

Furthermore, $R^2$ and $R^3$ each preferably represent, independently, a lower alkyl group of 1 to 5 carbon atoms. These types of groups tend to display a higher acid dissociability than a 2-methyl-2-adamantyl group.

Specifically, the groups $R^2$ and $R^3$ represent, independently, the same types of straight chain or branched alkyl groups described above for $R^1$. Of these groups, the case in which $R^2$ and $R^3$ are both methyl groups is preferred industrially.

The structural unit represented by the general formula (III') represents the case in which the carbon atom adjacent to the oxygen atom (—O—) of a separate ester section from the (meth)acrylate ester section is a tertiary alkyl group, and the separate ester section and the (meth)acrylate ester section are linked with a cyclic skeleton such as a tetracyclododecanyl group.

In the general formulas (III) and (III'), R represents the same meaning as in the general formulas (I) and (I').

Furthermore, $R^4$ is a tertiary alkyl group such as a tert-butyl group or a tert-amyl group, although structural units in which $R^4$ is a tert-butyl group are preferred industrially.

In particular, the use of either one or both (and preferably both) of the structural units represented by the general formulas (I) and (I)' is preferred, and the case in which $R^1$ is a methyl group, and $R^2$ and $R^3$ are both methyl groups offers particularly good resolution, and is consequently preferred.

In the structural units (a2) and (a2'), the lactone functional groups are effective in increasing the adhesion between the resist film and a substrate, and in improving the affinity with the developing liquid.

There are no particular restrictions on the structural units (a2) and (a2'), provided this type of lactone group containing monocyclic group or polycyclic group is present.

A specific example of a lactone containing monocyclic group is a group in which one hydrogen atom is removed from γ-butyrolactone.

Furthermore, specific examples of lactone containing polycyclic groups include groups in which one hydrogen atom is removed from a lactone containing bicycloalkane of one of the structural formulas shown below.

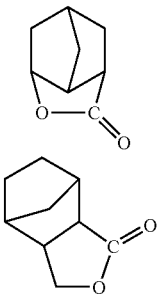

In addition, in either one or both (and preferably both) of the structural unit (a2) and the structural unit (a2'), the lactone containing monocyclic group or polycyclic group is preferably at least one structure selected from the general formulas (IV) or (V) shown below.

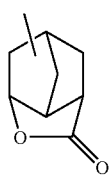

(IV)

-continued

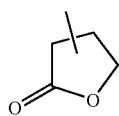
(V)

Specific examples of the structural units (a2) and (a2') include structural units derived from a (meth)acrylate ester comprising either a lactone group or a lactone containing bicycloalkyl group, as shown by the structural formulas below.

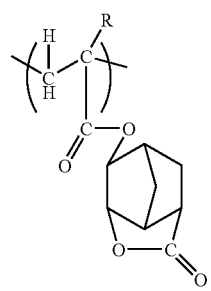

(wherein R is as described above)

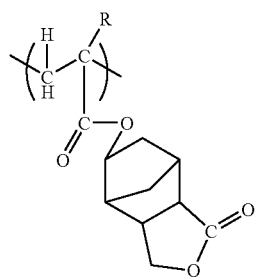

(wherein R is as described above)

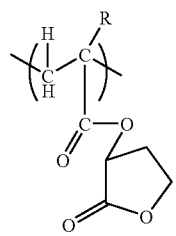

(wherein R is as described above)

Of these, γ-butyrolactone esters or norbornane lactone esters of (meth)acrylic acid with an ester linkage at the α carbon atom are particularly preferred in terms of industrial availability.

Because the hydroxyl group within the structural units (a3) and (a3') is a polar group, by using these structural units, the overall affinity of the resin component (A) with the developing liquid improves, and the alkali solubility within the exposed sections improves. Accordingly, the structural units (a3) and (a3') contribute to improved resolution.

In the structural units (a3) and (a3'), the polycyclic group can be selected appropriately from the same plurality of polycyclic groups described in relation to the aforementioned structural units (a1) and (a1').

There are no particular restrictions on these structural units (a3) and (a3') provided they are hydroxyl group containing polycyclic groups, and specific examples of preferred structures include hydroxyl group containing adamantyl groups.

In addition, if this hydroxyl group containing adamantyl group is of a structure represented by a general formula (VI) shown below, then the dry etching resistance can be improved, and the verticalness of the pattern cross-section can be improved, both of which are desirable.

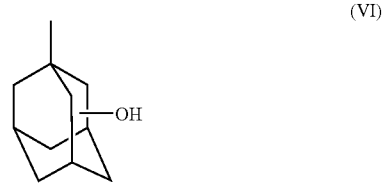
(VI)

Specifically, cases in which either one or both (and preferably both) of the structural units (a3) and (a3') are structural units represented by the general formula (VI') shown below are preferred.

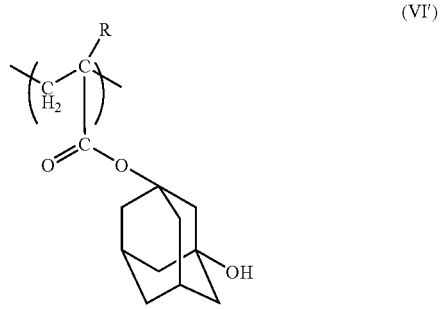
(VI')

(wherein, R is as described above)

Components (A) in which, relative to the combined total of all the structural units which make up the component (A), the combined total of the structural unit (a1) and the structural unit (a1') accounts for 30 to 60 mol %, and preferably from 30 to 50 mol %, offer superior resolution, and are consequently preferred.

Furthermore, components (A) in which, relative to the combined total of all the structural units which make up the component (A), the combined total of the structural unit (a2) and the structural unit (a2') accounts for 20 to 60 mol %, and preferably from 20 to 50 mol %, offer superior resolution, and are consequently preferred.

Furthermore, components (A) in which, relative to the combined total of all the structural units which make up the component (A), the combined total of the structural unit (a3) and the structural unit (a3') accounts for 1 to 50 mol %, and preferably from 20 to 40 mol %, offer superior resist pattern formation, and are consequently preferred.

In addition, for the aforementioned copolymer (A1), a copolymer (a) described below offers excellent resolution, and is preferred.

Copolymer (a): a copolymer formed from the aforementioned structural unit (a1'), the aforementioned structural unit (a2') and the aforementioned structural unit (a3).

In this copolymer (a), from the viewpoints of resolution and resist pattern formation, copolymers in which the structural unit (a1') accounts for 30 to 60 mol %, and preferably from 30 to 50 mol %, the structural unit (a2') accounts for 20 to 60 mol %, and preferably from 20 to 50 mol %, and the structural unit (a3) accounts for 1 to 50 mol %, and preferably from 20 to 40 mol %, relative to the combined total of the structural units (a l'), (a2'), and (a3), are preferred.

Furthermore, for the aforementioned mixed resin (A2), a mixed resin of a copolymer (b) described below and a copolymer (c) described below enables a good balance between improved etching resistance (surface roughness) and resolution, and is preferred.

Copolymer (b): a copolymer formed from 30 to 60 mol % of the aforementioned structural unit (a1), 20 to 60 mol % of the aforementioned structural unit (a2), and 1 to 50 mol %, and preferably from 5 to 40 mol % of the structural unit (a3).

Copolymer (c): a copolymer formed from 30 to 60 mol % of the structural unit (a1'), 20 to 60 mol % of the structural unit (a2'), and 1 to 50 mol %, and preferably from 5 to 40 mol % of the aforementioned structural unit (a3').

Furthermore in this mixed resin, the mass ratio between the copolymer (b) and the copolymer (c) is preferably within a range from 80:20 to 20:80.

In the copolymers (b) and (c), the incorporation of the structural unit (a3) and the structural unit (a3') respectively may also be optional.

However, by including either one or both (and preferably both) of the structural unit (a3) and the structural unit (a3'), because the hydroxyl group is a polar group, as described above, the overall affinity of the resin component (A) with the developing liquid improves, the alkali solubility within the exposed sections improves, and the structural units also contribute to improved resolution, all of which are desirable.

Furthermore, for the mixed resin (A2), a mixed resin of the copolymer (a) described above and the copolymer (b) described above also enables a good balance between improved etching resistance (surface roughness) and resolution, and is consequently preferred.

In this mixed resin, the mass ratio between the copolymer (a) and the copolymer (b) is preferably within a range from 80:20 to 20:80.

In the copolymer (b), the incorporation of the structural unit (a3) may also be optional, although including the structural unit (a3) contributes to improved resolution, and is consequently preferred.

Furthermore, for the aforementioned copolymer (A1), a copolymer (d) described below also offers superior resolution, and little surface roughness during etching, and is consequently preferred.

Copolymer (d): a copolymer formed from 30 to 60 mol %, and preferably from 30 to 50 mol % of the structural unit (a1'), 20 to 60 mol %, and preferably from 20 to 50 mol % of the aforementioned structural unit (a2), and 1 to 50 mol %, and preferably from 20 to 40 mol % of the structural unit (a3).

Furthermore as described above, the component (A) also preferably comprises, as a fourth structural unit, a structural unit [a structural unit (a4)] derived from a (meth)acrylate ester, and comprising a polycyclic group "which is different from the aforementioned acid dissociable, dissolution inhibiting group containing a polycyclic group, the aforementioned lactone containing monocyclic group or polycyclic group, or the aforementioned hydroxyl group containing polycyclic group".

The expression "which is different from the aforementioned acid dissociable, dissolution inhibiting group containing a polycyclic group, the aforementioned lactone containing monocyclic group or polycyclic group, or the aforementioned hydroxyl group containing polycyclic group" means that the polycyclic group of the structural unit (a4) does not duplicate any of the acid dissociable, dissolution inhibiting group containing a polycyclic group of the first structural unit, the lactone containing monocyclic group or polycyclic group of the second structural unit, nor the hydroxyl group containing polycyclic group of the third structural unit. In other words, the structural unit (a4) does not retain any acid dissociable, dissolution inhibiting groups containing a polycyclic group of the first structural unit, any lactone containing monocyclic groups or polycyclic groups of the second structural unit, nor any hydroxyl group containing polycyclic groups of the third structural unit.

There are no particular restrictions on this type of polycyclic group, provided that the polycyclic group is selected so that within a single component (A), no duplication occurs of the first through third structural units. For example, the polycyclic group can utilize the same polycyclic groups described above in relation to the structural units (a1) and (a1'), and any of the multitude of materials conventionally used as ArF positive resist materials can be used.

In particular, at least one polycyclic group selected from among tricyclodecanyl groups, adamantyl groups and tetracyclododecanyl groups is preferred because of the commercial availability of such groups.

For the structural unit (a4), a single component (A) may also comprise either one, or both of, a unit derived from an acrylate ester, and a unit derived from a methacrylate ester.

Specifically, the structural unit (a4) may be one of the structural units used for the copolymer (A1) as described above, or at least one of the structural units of the 1 or more resins which make up the mixed resin (A2), although from the viewpoint of the effects gained, the structural unit (a4) is preferably incorporated as a unit within a copolymer, together with the first though third structural units.

Specific examples of the structural unit (a4) are shown below.

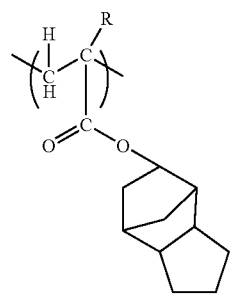

(wherein, R is a hydrogen atom or a methyl group)

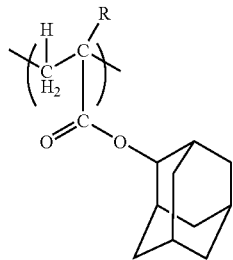

(wherein, R is a hydrogen atom or a methyl group)

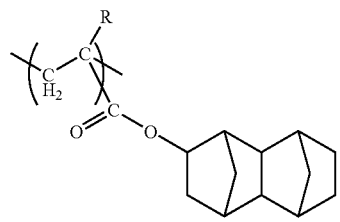

(wherein, R is a hydrogen atom or a methyl group)

If the proportion of the structural unit (a4) relative to the combined total of all the structural units of the component (A) is within a range from 1 to 25 mol %, and preferably from 10 to 20 mol %, then the resolution for isolated patterns through to semi dense patterns is excellent, which is preferred.

Furthermore, in those cases in which the structural unit (a4) is included, if the copolymer (A1) is a copolymer (e) described below, then in addition to the effects of the unit (a4) described above, the surface roughness and line edge roughness during etching also improves, which is desirable.

Copolymer (e): a copolymer formed from the structural unit (a1'), the structural unit (a2), the structural unit (a3), and the structural unit (a4).

In this copolymer (e), from the viewpoints of resolution and resist pattern formation, copolymers in which the structural unit (a1') accounts for 30 to 60 mol %, and preferably from 30 to 50 mol %, the structural unit (a2) accounts for 20 to 60 mol %, and preferably from 20 to 50 mol %, the structural unit (a3) accounts for I to 30 mol %, and preferably from 10 to 20 mol %, and the structural unit (a4) accounts for 1 to 25 mol %, and preferably from 10 to 20 mol %, relative to the combined total of the structural units (a1'), (a2), (a3) and (a4), are preferred.

In addition, if the mixed resin (A2) is a mixed resin of the aforementioned copolymer (d) and the copolymer (e), then the resolution of an isolated space pattern (trench) can be preferred, which is desirable.

Furthermore in this mixed resin, the mass ratio between the copolymer (d) and the copolymer (e) is preferably within a range from 80:20 to 20:80.

In the copolymers (d) and (e), the incorporation of the structural unit (a3) and the structural unit (a3') may also be optional.

However, by including either one or both (and preferably both) of the structural unit (a3) and the structural unit (a3'), because the hydroxyl group is a polar group, as described above, the overall affinity of the resin component (A) with the developing liquid improves, the alkali solubility within the exposed sections improves, and the structural units also contribute to improved resolution, all of which are desirable.

In addition, in the component (A) there are no particular restrictions on the mass average molecular weight of either the copolymer (A1), or the polymers which make up the resin mixture (A2), although values are typically within a range from 5000 to 30,000, and preferably from 8000 to 20,000. If the mass average molecular weight is larger than this range then solubility within the resist solvent deteriorates, whereas if the molecular weight is too small, there is a danger of a deterioration in the cross-sectional shape of the resist pattern.

The copolymer (A1) or the polymers of the mixed resin (A2) can be produced easily by a known radical polymerization or the like of the corresponding (meth)acrylate ester monomer using a radical polymerization initiator such as azobisisobutyronitrile (AIBN).

The acid generator component (B) can be appropriately selected from known materials used as acid generators in conventional chemically amplified resists.

Examples of the acid generator include onium salts such as diphenyliodonium trifluoromethanesulfonate, (4-methoxyphenyl)phenyliodonium trifluoromethanesulfonate, bis(p-tert-butylphenyl)iodonium trifluoromethanesulfonate, triphenylsulfonium trifluoromethanesulfonate, (4-methoxyphenyl)diphenylsulfonium trifluoromethanesulfonate, (4-methylphenyl)diphenylsulfonium nonafluorobutanesulfonate, (p-tert-butylphenyl)diphenylsulfonium trifluoromethanesulfonate, diphenyliodonium nonafluorobutanesulfonate, bis(p-tert-butylphenyl)iodonium nonafluorobutanesulfonate and triphenylsulfonium nonafluorobutanesulfonate. Of these, onium salts with a fluorinated alkylsulfonate ion as the anion are preferred.

This component (B) may utilize a single compound, or a combination of two or more compounds.

The quantity of the component (B) is preferably selected within a range from 0.5 to 30 parts by mass, and even more preferably from 1 to 10 parts by mass per 100 parts by mass of the resin component (A). If the quantity is less than 0.5 parts by mass then there is a danger of the pattern formation not proceeding satisfactorily, whereas if the quantity exceeds 30 parts by mass, then achieving a uniform solution becomes difficult, and there is a danger of a deterioration in storage stability.

In addition, a positive type resist composition of the present invention is produced by dissolving the component (A), the component (B) and an optional component (D), which is described below, preferably in an organic solvent (C).

The organic solvent (C) can be any solvent capable of dissolving the component (A) and the component (B) to generate a uniform solution, and the solvent used can be one, or two or more solvents selected from amongst known solvents used for conventional chemically amplified resists.

Examples of the solvent include ketones such as acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or the monomethyl ether, monoethyl ether, monopropyl ether, monobutyl ether or monophenyl ether of dipropylene glycol monoacetate; cyclic ethers such as dioxane; and esters such as methyl lactate, ethyl lactate, methyl acetate, ethyl acetate, butyl acetate, methyl pyruvate, ethyl pyruvate, methyl methoxypropionate, and ethyl ethoxypropionate. These organic solvents can be used singularly, or as a mixed solvent of two or more solvents.

In particular, mixed solvents of propylene glycol monomethyl ether acetate (PGMEA) and a polar solvent containing a hydroxyl group or lactone such as propylene glycol monomethyl ether (PGME), ethyl lactate (EL) or γ-butyrolactone offer good improvement in the storage stability of the positive type resin composition, and are consequently preferred.

In those cases in which EL is used, the mass ratio of PGMEA:EL is preferably within a range from 6:4 to 4:6.

In those cases in which PGME is used, the mass ratio of PGMEA:PGME is typically within a range from 8:2 to 2:8, and preferably from 8:2 to 5:5.

Mixed solvents of PGMEA and PGME improve the storage stability in those cases in which a component (A) which comprises all of the first through fourth structural units is used, and are consequently preferred.

Mixed solvents containing at least one of PGMEA and ethyl lactate, together with γ-butyrolactone are also preferred as the organic solvent (C). In such cases, the mass ratio of the former and latter components in the mixed solvent is preferably within a range from 70:30 to 95:5.

Furthermore, in a positive type resist composition of the present invention, in order to improve the resist pattern shape and the post exposure stability of the latent image formed by the pattern-wise exposure of the resist layer, a secondary lower aliphatic amine or a tertiary lower aliphatic amine (D) can also be added as an optional component (D).

Here, a lower aliphatic amine refers to an alkyl amine or an alkyl alcohol amine of no more than 5 carbon atoms, and examples of these secondary and tertiary amines include trimethylamine, diethylamine, triethylamine, di-n-propylamine, tri-n-propylamine, tripentylamine, diethanolamine and triethanolamine, and alkanolamines such as triethanolamine are preferred.

These may be used singularly, or in combinations of two or more compounds.

These types of amines are typically added in quantities within a range from 0.01 to 0.2 mass % relative to the quantity of the component (A).

Miscible additives can also be added to a positive type resist composition of the present invention according to need, including additive resins for improving the properties of the resist film, surfactants for improving the ease of application, dissolution inhibitors, plasticizers, stabilizers, colorants and halation prevention agents.

Namely, a positive type resist composition of the present invention is first applied to the surface of a substrate such as a silicon wafer using a spinner or the like, a prebake is conducted under temperature conditions of 80 to 150° C. for 40 to 120 seconds, and preferably for 60 to 90 seconds, and then following selective exposure of an ArF excimer laser through a desired mask pattern using, for example, an ArF exposure apparatus, PEB (post exposure baking) is conducted under temperature conditions of 80 to 150° C. for 40 to 120 seconds, and preferably for 60 to 90 second. Subsequently, developing is conducted using an alkali developing liquid such as a 0.1 to 10 mass % aqueous solution of tetramethylammonium hydroxide. In this manner, a resist pattern which is faithful to the mask pattern can be obtained.

An organic or inorganic anti-reflective film may also be provided between the substrate and the applied layer of the resist composition.

Furthermore, although a composition of the present invention is particularly applicable to ArF excimer lasers, it is also effective for other types of radiation of shorter wavelength such as $F_2$ lasers, EUV (extreme ultraviolet radiation), VUV (vacuum ultraviolet radiation), electron beams, X-rays and soft X-rays.

In the present invention, by using this type of configuration, a chemically amplified positive type resist composition which displays little surface roughness or line edge roughness on etching, and also offers excellent resolution and a wide depth of focus range can be obtained.

The reasons for these effects are not entirely clear, but are believed to be as follows.

Namely, it is thought that structural units derived from methacrylate esters display excellent lithography characteristics such as resolution and depth of focus, but tend to display increased surface roughness.

In contrast, it is thought that structural units derived from acrylate esters display a large surface roughness improvement effect but their lithography characteristics such as the resolution tend to be unsatisfactory.

The fact that structural units derived from acrylate esters probably contribute towards improvements in the surface roughness was first discovered by the inventors of the present invention, and had previously been unknown.

Accordingly, by using a base resin (the component (A)) comprising a combination of a structural unit derived from a methacrylate ester and a structural unit derived from an acrylate ester, it is surmised that the shortcomings of both can be offset, and a resin displaying the benefits of both can be produced.

Furthermore, in a positive type resist composition of the present invention, in addition to the effects which might be expected based on the characteristics of these two types of structural unit, an additional reduction in defects is also achieved. Here, the term "defect" refers to scum and general resist pattern abnormalities detected by inspection of a resist pattern following developing, from directly above the resist pattern, using a surface defect inspection device (brand name: KLA) from KLA Tencor Corporation.

EXAMPLES

As follows is a more detailed description of the present invention using a series of examples.

Example 1

A positive type resist composition was produced by dissolving a component (A), a component (D) uniformly in a component (C), all of which are described below.

Component (A): a mixed resin comprising 50 parts by mass of an acrylate ester based copolymer (mass average molecular weight: 14,000) formed from structural units x, y and z shown below (x=40 mol %, y=30 mol %, z=30 mol %),

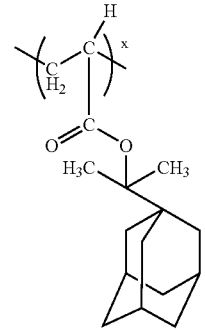

-continued

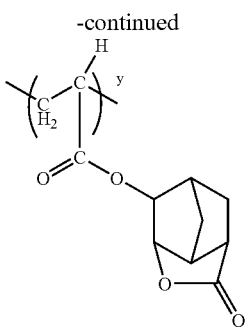

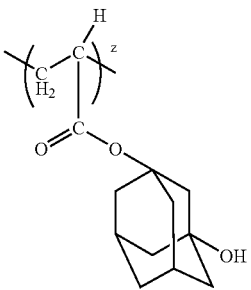

and 50 parts by mass of a methacrylate ester based copolymer (mass average molecular weight: 10,000) formed from structural units p, q and 1 shown below (p=40 mol %, q=40 mol %, 1=20 mol %).

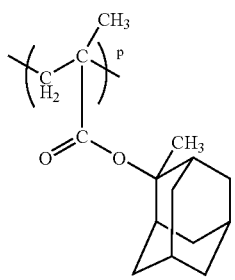

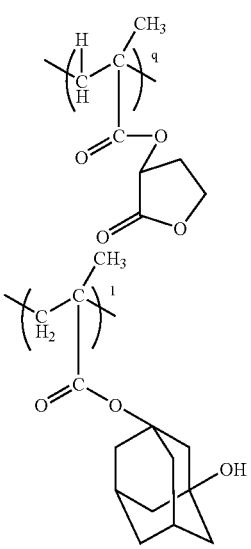

Component (B): 3 parts by mass of triphenylsulfonium nonafluorobutanesulfonate

Component (C): A mixed solvent of 450 parts by mass of propylene glycol monomethyl ether acetate and 300 parts by mass of ethyl lactate.

Component (D): 0.2 parts by mass of triethanolamine.

Subsequently, this positive type resist composition was applied to the surface of a silicon wafer using a spinner, prebaked for 90 seconds at 120° C. on a hotplate, and then dried to form a resist layer with a film thickness of 400 nm.

This film was then selectively irradiated with an ArF excimer laser (193 nm) through a mask pattern, using an ArF exposure apparatus (Micro Step, manufactured by ISI Corporation, NA (numerical aperture) =0.60, σ=0.75).

The film was then subjected to PEB treatment at 110° C. for 90 seconds, subsequently subjected to puddle development for 60 seconds at 23° C. in a 2.3 mass % aqueous. solution of tetramethylammonium hydroxide, and was then washed for 20 seconds with water, and dried.

As a result, a 130 nm resist line pattern (1:1) was formed with good shape, and the depth of focus range was 700 nm.

Furthermore, when the 3σ value, which is a measure of the line edge roughness of the line and space pattern, was determined, the result was 6.3 nm.

The 3σ value is determined by measuring the resist pattern width of the sample at 32 positions using a measuring SEM (S-9220, a brand name, manufactured by Hitachi, Ltd.), and calculating the value of 3 times the standard deviation 3σ from these measurement results. The smaller this 3σ value is, the lower the level of roughness, indicating a resist pattern with a uniform width.

With regard to defects, a resist hole pattern with a hole diameter of 250 nm was inspected using a surface defect inspection device KLA2132 from KLA Tencor Corporation, and revealed 0 defects.

In addition, in order to evaluate the surface roughness following etching, an unpatterned resist film was prepared (by applying a positive type resist composition to a substrate and conducting exposure without using a mask pattern), and subsequently etched under the following conditions.

Etching Conditions

Gas: A mixed gas comprising tetrafluoromethane: 30 sccm, trifluoromethane: 30 sccm, and helium; 100 sccm.

Pressure: 0.3 Torr

RF (Radio frequency): Frequency: 400 kHz, output: 600 W

Temperature: 20° C., time: 2 minutes

Etching apparatus: TCE-7612X (a brand name, manufactured by Tokyo Ohka Kogyo Co., Ltd.)

The reason for performing the evaluation using an unpatterned resist film is that this enables surface roughness to be measured more easily.

The surface following this etching was numericalized with an AFM (Atomic Force Microscope), and when the Rms value (root mean square surface roughness), which is a value representing the surface roughness, was then determined, the result was 2.5 nm.

Example 2

With the exception of altering the component (A) in the manner described below, a positive type resist composition was prepared, and pattern formation was conducted, in the same manner as Example 1.

Component (A): A mixed resin comprising a polymer (mass average molecular weight: 15,000) in which the structural units y and z within the acrylate ester based copolymer used in Example 1 were altered to 50 mol % and 20 mol % respectively, and the structural unit x was replaced with 30 mol % of a structural unit m shown below, and a polymer (mass average molecular weight: 10,000) in which the structural unit q within the methacrylate ester based copolymer used in Example 1 was replaced with a structural unit n shown below. The proportions of the structural units p, n and l were the same as the proportions of the structural units p, q and l respectively used in Example 1.

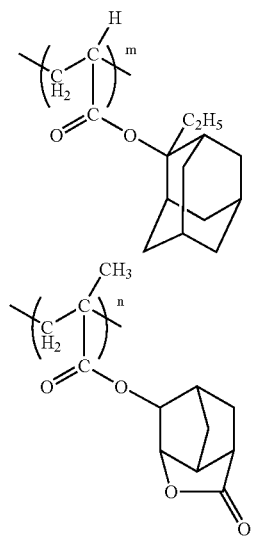

As a result, a 130 nm line and space pattern (1:1) was formed with good shape, and the depth of focus range was 700 nm. Furthermore, determination of the 3σ value revealed a result of 5.8 nm.

Inspection for defects was also conducted in the same manner as Example 1, and revealed 0 defects.

Furthermore, evaluation of the surface roughness in the same manner as Example 1 revealed an Rms value of 2.2 nm.

Example 3

With the exception of altering the component (A) in the manner described below, a positive type resist composition was prepared, and pattern formation was conducted, in the same manner as Example 1.

Component (A): A mixed resin comprising 50 parts by mass of the acrylate ester based copolymer used in Example 1 (mass average molecular weight: 14,000), and 50 parts by mass of an acrylate ester/methacrylate ester copolymer (wherein the structural unit 1 in the methacrylate ester based copolymer of Example 1 was replaced with the same mol % of the corresponding acrylate ester derivative) (mass average molecular weight: 10,000).

As a result, a 130 nm line and space pattern (1:1) was formed with good shape, and the depth of focus range was 600 nm. Furthermore, determination of the 3σ value revealed a result of 5.9 nm.

Inspection for defects was also conducted in the same manner as Example 1, and revealed 0 defects.

Furthermore, evaluation of the surface roughness in the same manner as Example 1 revealed an Rms value of 2.0 nm.

Example 4

With the exception of altering the component (A) in the manner described below, a positive type resist composition was prepared, and pattern formation was conducted, in the same manner as Example 1.

Component (A): 100 parts by mass of an acrylate ester/methacrylate ester copolymer (wherein the acrylate ester copolymer from Example 1 was not used, and the structural unit 1 in the methacrylate ester based copolymer of Example 1 was replaced with the same mol % of the corresponding acrylate ester) (mass average molecular weight: 10,000).

As a result, a 130 nm line and space pattern (1:1) was formed with good shape, and the depth of focus range was 800 nm. Furthermore, determination of the 3σ value revealed a result of 6.8 nm.

Inspection for defects was also conducted in the same manner as Example 1, and revealed 0 defects.

Furthermore, evaluation of the surface roughness in the same manner as Example 1 revealed an Rms value of 2.5 nm.

Comparative Example 1

With the exception of altering the component (A) in the manner described below, a positive type resist composition was prepared, and pattern formation was conducted, in the same manner as Example 1.

Component (A): 100 parts by mass of only the methacrylate ester copolymer used in Example 1.

As a result, a 130 nm line and space pattern (1:1) was formed with good shape, although the depth of focus range was 500 nm. Furthermore, determination of the 3σ value revealed a result of 14.0 nm.

Inspection for defects was also conducted in the same manner as Example 1, and revealed 0 defects.

Furthermore, evaluation of the surface roughness in the same manner as Example 1 revealed an Rms value of 12.8 nm.

Comparative Example 2

With the exception of altering the component (A) in the manner described below, a positive type resist composition was prepared, and pattern formation was conducted, in the same manner as Example 1.

Component (A): 100 parts by mass of only the acrylate ester copolymer used in Example 1.

As a result, a 130 nm line and space pattern (1:1) was formed with good shape, although the depth of focus range was 200 nm. Furthermore, determination of the 3σ value revealed a result of 3.7 nm.

Inspection for defects was also conducted in the same manner as Example 1, and revealed 500 defects.

Furthermore, evaluation of the surface roughness in the same manner as Example 1 revealed an Rms value of 1.1 nm.

From the above results it is evident that in each of the examples according to the present invention, the shape of the line and space pattern was good, the depth of focus range was large, line edge roughness was minimal, and absolutely no defects were observed.

In contrast, in Comparative Example I which used a base resin formed from only methacrylate ester structural units, line edge roughness and surface roughness were large, whereas in Comparative Example 2 which used a base resin formed from only acrylate ester structural units, the depth of focus range was small and a multitude of defects were observed.

Example 5

A positive type resist composition was produced by dissolving a component (A), a component (B), a component (D) and an additive uniformly in a component (C), all of which are described below.

Component (A): 100 parts by mass of an acrylate ester/methacrylate ester copolymer (mass average molecular weight: 10,000, polydispersity-1.80) formed from structural units x, y, z and p shown below (x=35 mol %, y=40 mol %, z=15 mol %, p=10 mol %).

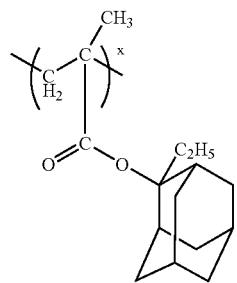

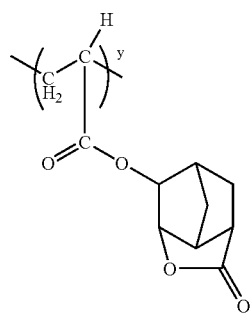

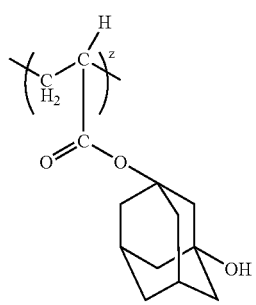

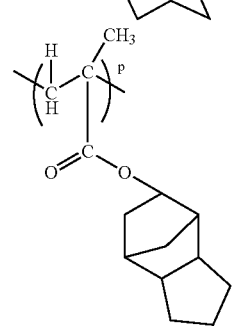

Component (B): 3.5 parts by mass of triphenylsulfonium nonafluorobutanesulfonate Component (D): 0.3 parts by mass of triethanolamine.

Additive: 0.1 parts by mass of a fluorine/silicon based surfactant R08 (manufactured by Dainippon Ink and Chemicals, Inc.).

Component (C): A mixed solvent of 450 parts by mass of PGMEA, 300 parts by mass of PGME, and 25 parts by mass of γ-butyrolactone.

An organic anti-reflective film AR-19 (manufactured by Shipley Co., Ltd.) (film thickness: 82 nm) was provided on top of a silicon wafer, and the positive type resist composition described above was then coated onto this anti-reflective film on the silicon wafer using a spinner.

Subsequently, the positive type resist composition was dried for 90 seconds at 95° C. on a hotplate (pre bake) to form a resist layer with a film thickness of 330 nm.

This film was then selectively irradiated with an ArF excimer laser (193 nm) through a mask, using an ArF exposure apparatus S302 (manufactured by Nikon Corporation, NA=0.60), subjected to FEB treatment at 95° C. for 90 seconds, subsequently subjected to puddle development for 30 seconds at 23° C. in a 2.38 mass % aqueous solution of tetramethylammonium hydroxide, and was then washed for 20 seconds with water, and dried.

The 100 nm isolated line pattern formed by the above operation was formed with good shape, the sensitivity was 23 mJ/cm$^2$, and the depth of focus range was 450 nm. Furthermore, the limiting resolution of the isolated line pattern was 60 nm.

In addition, a 130 run line and space pattern (a semi dense pattern in which the combined total of the resist pattern width and the space pattern width was 340 nm) was formed with good shape using the same operation, and the depth of focus range was 1000 nm.

Furthermore, determination of the 3σ value revealed a result of 5.0 nm.

In addition, in order to evaluate the surface roughness following etching, the Rms value (root mean square surface roughness) was determined in a similar manner to Example 1, and revealed a result of 2.5 nm.

Furthermore, even when the positive type resist composition of this example was stored for 60 days at room temperature, the storage stability as a resist solution was good.

Example 6

With the exception of altering the component (C) from Example 5 to a mixed solvent of 750 parts by mass of PGMEA and 25 parts by mass of γ-butyrolactone, a positive type resist composition was prepared in the same manner as Example 5.

Furthermore, when pattern formation was conducted under the same lithography conditions as Example 5, the same lithographic characteristics as Example 5 were obtained, except for the fact that the sensitivity was 22 mJ/cm$^2$.

Furthermore, even when the positive type resist composition of this example was stored for 30 days at room temperature, the storage stability as a resist solution was good.

From the results of Examples 5 and 6 it is evident that by using a resin which includes a fourth structural unit, in addition to the surface roughness effects and the like described above, a positive type resist composition can be obtained which also displays excellent resolution for isolated patterns and semi dense patterns.

Example 7

A positive type resist composition was produced by dissolving a component (A), a component (B), a component (D) and an additive uniformly in a component (C), all of which are described below.

Component (A): 100 parts by mass of an acrylate ester/methacrylate ester copolymter (mass average molecular weight: 11,0, polydispersity: 1.9) formed from the structural units shown below (x =30 mol %, y=50 mol %, z=20 mol %).

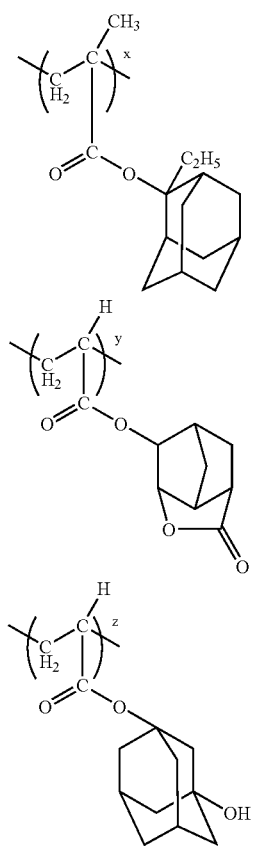

Component (B): 3.5 parts by mass of (p-methylphenyl) diphenylsulfonium nonafluorobutanesulfonate
Component (C): A mixed solvent of 450 parts by mass of propylene glycol monomethyl ether acetate (PGMEA), 300 parts by mass of propylene glycol monomethyl ether (PGME), and 25 parts by mass of γ-butyrolactone.
Component (D): 0.3 parts by mass of triethanolamine.
Additive: 0.1 parts by mass of a fluorine/silicon based surfactant R08 (manufactured by Dainippon Ink and Chemicals, Inc.).

An organic anti-reflective film AR-19 (manufactured by Shipley Co., Ltd.) was provided on top of a silicon wafer at a film thickness of 82 nm, and the resist solution described above was then coated onto this anti-reflective film on the silicon wafer using a spinner, and then dried for 90 seconds at 105° C. on a hotplate (pre bake) to form a resist layer with a film thickness of 340 nm.

This film was then selectively irradiated with an ArF excimer laser (193 nm) through a mask, using an ArF exposure apparatus NSR-S302 (manufactured by Nikon Corporation, NA=0.60), subjected to PEB treatment at 100° C. for 90 seconds, subsequently subjected to puddle development for 30 seconds at 23° C. in a 2.38 mass % aqueous solution of tetramethylammonium hydroxide, and was then washed for 20 seconds with water, and dried.

As a result, a 130 nm line and space pattern (1:1) was formed with good shape, and the depth of focus range was 800 nm.

Furthermore, determination of the 3σ value, which is a measure of the LER of the line and space pattern, revealed a result of 6.0 nm.

In addition, in order to evaluate the surface roughness following etching, the Rms value (root mean square surface roughness) was determined in a similar manner to Example 1, and revealed a result of 2.5 nm.

Furthermore, even when the resist solution described above was stored for 30 days at room temperature, the storage stability as a resist solution was good.

Example 8

With the exception of replacing 50 parts by mass of the acrylate ester/methacrylate ester copolymer used in Example 7 with 50 parts by mass of the quaternary acrylate ester/methacrylate ester copolymer used in Example 5, and combining the two copolymers to form the component (A), a positive type resist composition was produced in the same manner as Example 7, and pattern formation was also conducted in the same manner as Example 7.

As a result, the 100 nm isolated line pattern formed by the above operation was formed with good shape, the sensitivity was 23 mJ/cm², and the depth of focus range was 450 nm. Furthermore, the limiting resolution of the isolated line pattern was 75 nm.

In addition, a 130 nm line and space pattern (a semi dense pattern in which the combined total of the resist pattern width and the space pattern width was 340 mn) produced by the same operation was formed with good shape using the same operation, and the depth of focus range was 1000 mn.

Furthermore, determination of the 3σ value, which is a measure of the LER of the line and space pattern, revealed a result of 5.3 nm.

In addition, in order to evaluate the surface roughness following etching, the Rms value (root mean square surface roughness) was determined in a similar manner to Example 1, and revealed a result of 2.5 nm.

Furthermore, even when the resist solution described above was stored for 30 days at room temperature, the storage stability as a resist solution was good.

From the results of Examples 7 and 8 it is evident that in Example 7, which used a resin with 3 structural units, a surface roughness reduction effect was achieved, and that in Example 8, which used a resin which also comprised a fourth structural unit, in addition to the above surface roughness reduction effect, a positive type resist composition can be obtained which also displays excellent resolution for isolated patterns and semi dense patterns. Furthermore, in both Example 7 and Example 8, a mixed solvent of PGMEA and a polar solvent was used, and consequently the storage stability s was good.

INDUSTRIAL APPLICABILITY

As described above, a positive type resist composition and a resist pattern formation method of the present invention are able to provide a chemically amplified positive type resist composition which displays little surface roughness and line edge roughness on etching, offers excellent resolution and a wide depth of focus range, and also enables a reduction in the number of defects, as well as a resist pattern formation method which uses such a composition.

What is claimed is:

1. A positive type resist composition comprising (A) a resin component comprising within the principal chain a structural unit derived from a (meth)actylate ester and incorporating an acid dissociable, dissolution inhibiting group containing a polycyclic group on an ester side chain section, for which solubility in alkali increases under action of acid, (B) an acid generator component which generates acid on exposure, and (C) an organic solvent, wherein
said component (A) further comprises both of:
a structural unit (a3) derived from an acrylate ester, and comprising a hydroxyl group containing polycyclic group, and
a structral unit (a3') derived from a methacrylate ester, and comprising a hydroxyl group containing polycyclic group.

2. A positive type resist composition according to claim 1, wherein within either one or both of said structural unit (a3) and said structural unit (a3'):
said hydroxyl group containing polycyclic group is a hydroxyl group containing adamantyl group.

3. A positive type resist composition according to claim 2, wherein said hydroxyl group containing adamantyl group is represented by a general formula (VI) shown below,

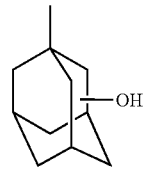

(VI)

4. A positive type resist composition according to claim 1, wherein
relative to a combined total of all structural units which make up said component (A), a combined total of said structural unit (a3) and said structural unit (a3') accounts for 1 to 50 mol %.

5. A positive type resist composition according to claim 1, wherein said component (B) is an onium salt with a fluorinated alkylsulfonate ion as an anion.

6. A positive type resist composition according to claim 1, wherein said organic solvent (C) is a mixed solvent of propylene glycol monomethyl ether acetate and a polar solvent.

7. A positive type resist composition according to claim 6, wherein said polar solvent is one, or two or more solvents selected from a group consisting of propylene glycol monomethyl ether, ethyl lactate and γ-butyrolactone.

8. A positive type resist composition according to claim 1, further comprising (D) a secondary or tertiary lower aliphatic amine in a quantity within a range from 0.01 to 0.2 mass % relative to a quantity of said component (A).

* * * * *